March 31, 1970 F. M. WANLASS ET AL 3,503,124

METHOD OF MAKING A SEMICONDUCTOR DEVICE

Filed Feb. 8, 1967 2 Sheets-Sheet 1

INVENTORS
FRANK M. WANLASS
ALDO MECCHI
WARREN H. MULLER
BY Jan ce and Franklin
ATTORNEY

METHOD OF MAKING A SEMICONDUCTOR DEVICE

Filed Feb. 8, 1967 2 Sheets-Sheet 2

INVENTORS
FRANK M. WANLASS
ALDO MECCHI
WARREN H. MULLER
BY
James and Franklin
ATTORNEY 3,503,124
METHOD OF MAKING A SEMICONDUCTOR DEVICE Frank M. Wanlass, 30 Mulberry Court, Jericho, N.Y. 11753; Aldo Mecchi, 102 E. Cypress Lane, Westbury, N.Y. 11590; and Warren H. Muller, 2 Wyngate Place, Great Neck, N.Y. 11021

Filed Feb. 8, 1967, Ser. No. 614,715
Int. Cl. H01l 11/14
U.S. Cl. 29—571 14 Claims

ABSTRACT OF THE DISCLOSURE

Accurate registration of gate electrode with gate area is achieved by forming the gate area in registration with an opening in an oxide layer and using that opening, in conjunction with a specific photo-resist process, to fix the location and limit the size of the gate electrode.

Figure 1:
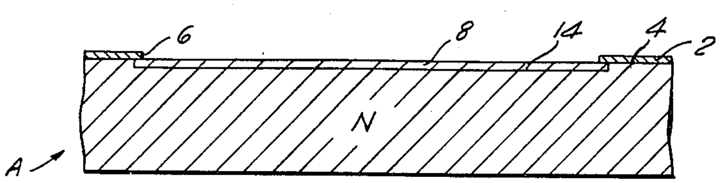

The present invention relates to an improved semiconductor device and to an improved method of making it. It has to do particularly with semiconductor devices of very minute size in which conductive electrode areas must be formed which are in accurate registration with appropriate areas of the semiconductor body.

The trend in the manufacture of semiconductor units is toward greater and greater miniaturization. This tendency has already proceeded sufficiently far, and devices made in accordance therewith are already sufficiently commercially available, so that space considerations are no longer a controlling factor in the design of electric equipment. Integrated circuits can already be constructed which are so small that the size and space which they take up is not critical. There is still some desirability in being able to further reduce the size of the units involved.

In addition to size per se, there are significant characteristics of prior art integrated circuits and semiconductor devices which are related to size and which limit their applicability and utility. In particular reliability of manufacture—the ability to make the devices on a commercial scale to accurate specifications and without an undue number of rejects—and speed of response—the rapidity with which a given device will react to a change in applied signal—are limiting factors in the electric circuit technology as known heretofore. While the art has been able to construct semiconductor devices with exteremly rapid response times, on the order of a few nanoseconds, this has been considered the ultimate, yet improvement in speed of response would make the scope of applicability and utility of semiconductor devices even greater than it has been. Another problem which has arisen in connection with very small semiconductor devices is the inherent capacity between the gate or control electrode and the output electrode, this capacitance producing an inherent feedback effect which is undesirable and limits the usefulness of the devices in question.

Speeds of response of semiconductor devices are today so rapid as to be limited in large part by the geometry of the devices. For example, in a field effect device consisting of a pair of output operative areas (drain and source) separated by a control or gate area, the width of the gate area which defines the spacing between the source and drain areas controls the time of response. The problem is one of fabrication, and does not relate so much to the actual dimension of the gate area width as it does to positioning the gate area properly and then forming and positioning the electrode which is to function therewith. In practical devices gate areas having a width of about 8 microns have been attained, but up to the time of this invention no practical method has been known for producing devices having gate areas of lesser width. A method for producing semiconductor devices having gate areas of that width and providing gate electrodes which register accurately with those gate areas is disclosed in the copending application of Frank M. Wanlass, Ser. No. 566,837, filed July 21, 1966, and entitled "Method of Doping Semiconductor Device," which is assigned to the assignee of this application. In accordance with that method, the best known to applicants prior to the instant invention, a gate electrode is formed which is appropriately registered and closely spaced with respect to the gate area of the semiconductor device, but that gate electrode slightly overlaps the source and drain areas adjacent the gate area. The overlap is comparatively small, on the order of about 6 microns, and is exceedingly small when compared to that which could be accomplished by methods known prior to the invention involved in the aforementioned application Ser. No. 566,837, but said overlap nevertheless gave rise to a reduction in the speed of response of the device. The existence of the overlap also requires that the device be somewhat larger, by the amount of said overlap, than would otherwise be the case.

The prime object of the present invention is to devise semiconductor devices which are significantly faster in response than the best that has heretofore been known. In accordance with the practice of the present invention devices are produced having response times which are faster by a factor of ten than previously known devices.

It is a further prime object of the present invention to devise semiconductor devices the feedback capacitance of which is significantly decreased. By the practice of the present invention a decrease in feedback capacitance by a factor of twenty to forty is achieved.

It is a further prime object of the present invention to devise semiconductor devices which can be made significantly smaller than has been thought possible. By the practice of the present invention an improvement in packing density by a factor of four is realized.

It is a further prime object of the present invention to devise a method for the manufacture of such significantly improved semiconductor devices which is amenable to commercial use and which is sufficiently reliable and accurate so that the number of rejects is held to a satisfactory minimum value.

The present invention permits accurate control of the location of those areas of the semiconductor body which must be doped, facilitates the accomplishment of the desired doping, is readily adaptable to the fabrication of many different types and designs of devices, and particularly those devices designed to be incorporated into printed circuitry, and it will have special, although not exclusive, utility in connection with the manufacture of field effect devices. Significantly, the method can be carried out conveniently on a production scale with only minimal use of special equipment and without having to take exececessive precautions. In particular, where photoresist methods are employed to form external electrical connections, as is conventional in the manufacture of integrated circuitry, appreciable latitude is permitted in registering the photographic negative or mask for those external connections with the semiconductor body, the registration of the gate electrode with the gate area of the semiconductor body being accomplished with considerably greater accuracy and with considerably less trouble than is required in registering the photographic negative or mask as aforesaid.

In accordance with the present invention a preliminary semiconductor unit is produced the body of which has an operative surface with two operative areas extending thereto and separated by an indentation in that surface, a first oxide layer being present in that indentation and interposed between the operative body areas, a second and preferably thicker oxide layer being provided over portions of the operative areas which extend to said operative surface adjacent said indentation, the second oxide layer defining an opening which registers and communicates with the first oxide layer. This may be accomplished more or less as taught in the aforesaid application Ser. No. 566,837, the construction in question being essentially that of FIG. 7 of the copending application. The area of the semiconductor body covered by the first oxide layer will constitute the control or gate area thereof in the embodiment here specifically disclosed. The opening defined by the second oxide layer therefore registers with the gate area. The gate electrode is formed in that opening and substantially only in that opening. As a result the gate electrode registers accurately with the gate area of the device with substantially no overlap with respect to the source and drain areas adjacent the gate area. The gate electrode may be formed concurrently with the formation of source and drain area electrodes and with ex-external conductive lead portions which make electrical connection with the source, drain and gate electrodes respectively.

In accordance with the method aspects of the present invention, formation of the gate electrode rigorously within the opening in the second oxide layer and with substantially no overlap relative to the adjacent source and drain areas is accomplished by using a photo-resist method which does not require a registering light mask insofar as gate electrode formation is concerned. To that end a layer of conductive material is formed over the upper surface of the second oxide layer and in the opening defined thereby, the conductive material completely covering the first oxide layer but incompletely filling the opening in the second oxide layer, a valley between a pair of conductive material mountains being defined within that opening. A layer of photo-resist material is then placed on the upper surface of the device, that photo-resist material filling the valley and having a substantially level upper surface. As a result the thickness of the photo-resist material in the valley will be greater than the thickness of the photo-resist material to either side of the valley, that is to say, over the source and drain areas. The thus-coated body is then exposed to light of an intensity and for a duration of time such as to cause exposure of the photo-resist layer only to a depth substantially corresponding to the thickness of the layer over the source and drain areas. This will leave the photo-resist material in the trough of the valley unexposed. Thereafter the exposed photo-resist material is removed, but the unexposed photo-resist material in the trough of the valley will remain in place. Those portions of the conductive coating which are thus exposed are then removed, as by etching, but the photo-resist material which remained in the valley troughs prevents removal of the conductive material thereunder. That conductive material thereunder, which remains in place, constitutes the gate electrode, and it will be seen that it accurately registers with the gate area with substantially no overlap relative to the adjacent source and drain areas.

Holes may be provided through the second oxide layer in registration with the source and drain areas, which holes may receive conductive material which is subsequently covered by photo-resist material. When the device is subjected to light the photo-resist material above these holes may be masked, thereby to prevent exposure of the photo-resist material under the opaque portions of the mask. Those photo-resist portions will remain and will thus prevent the removal of the conductive material thereunder, thereby producing the source and drain electrodes. This may be done in conjunction with the formation in similar fashion of external electrical lead connections to all three electrodes.

Because no accurate registration is required between the gate area and any external device such as a mask or photographic negative insofar as the formation of the gate electrode is concerned, it is feasible to make the gate electrode of considerably lesser width than has previously been deemed possible, and this without any sacrifice in the accuracy of registration between the gate electrode and the gate area with which it is to function.

The aforementioned application Ser. No. 566, 837 teaches that the gate electrode be formed within the opening in the second oxide layer which is used in the production of, and which therefore registers with, the gate area. To form the gate electrode, however, it was necessary to accurately position an optical mask relative to the device, and because of the physical limitation and inescapable mechanical error involved in such positioning it was necessary that the width of that gate electrode exceed the width of the gate area. The advantage presented by the aforementioned application in this regard was that those overlapping portions of the gate electrode were spaced from the overlapped source and drain areas by an appreciable distance, the thickness of the second oxide layer. This represented a marked improvement over the theretofore known constructions, in that the capacitance between the gate electrode and the source and drain areas was greatly reduced. By the practice of the present invention, however, the overlap is reduced to or virtually to zero, thus further and very markedly reducing the capacitance between the gate electrode and the source and drain areas while at the same time permitting the width of the gate area to be significantly reduced. Where the overlap or feedback capacitance in prior art devices was about 2–3 picofarads, the corresponding capacitance in devices made in accordance with the present invention is about .05–.1 picofarad.

The accepted figure of merit with regard to speed or response in devices of the type under discussion is represented by the expression $G_m/C_g$, where $G_m$ (transconductance) is directly related to the width of the gate area and $C_g$ is the capacitance seen by the gate electrode, (which includes, but is not limited to, the gate-drain feedback capacitance). With devices of the present invention an improvement in figure of merit by a factor of 8 is produced when compared with standard prior art devices, $G_m$ increasing by a factor of 2 because the width of the gate area is cut in half and $C_g$ decreasing by a factor of 4 because of the geometry of the gate electrode relative to the remainder of the device.

Figures 7, 8, 9, 10, 11:
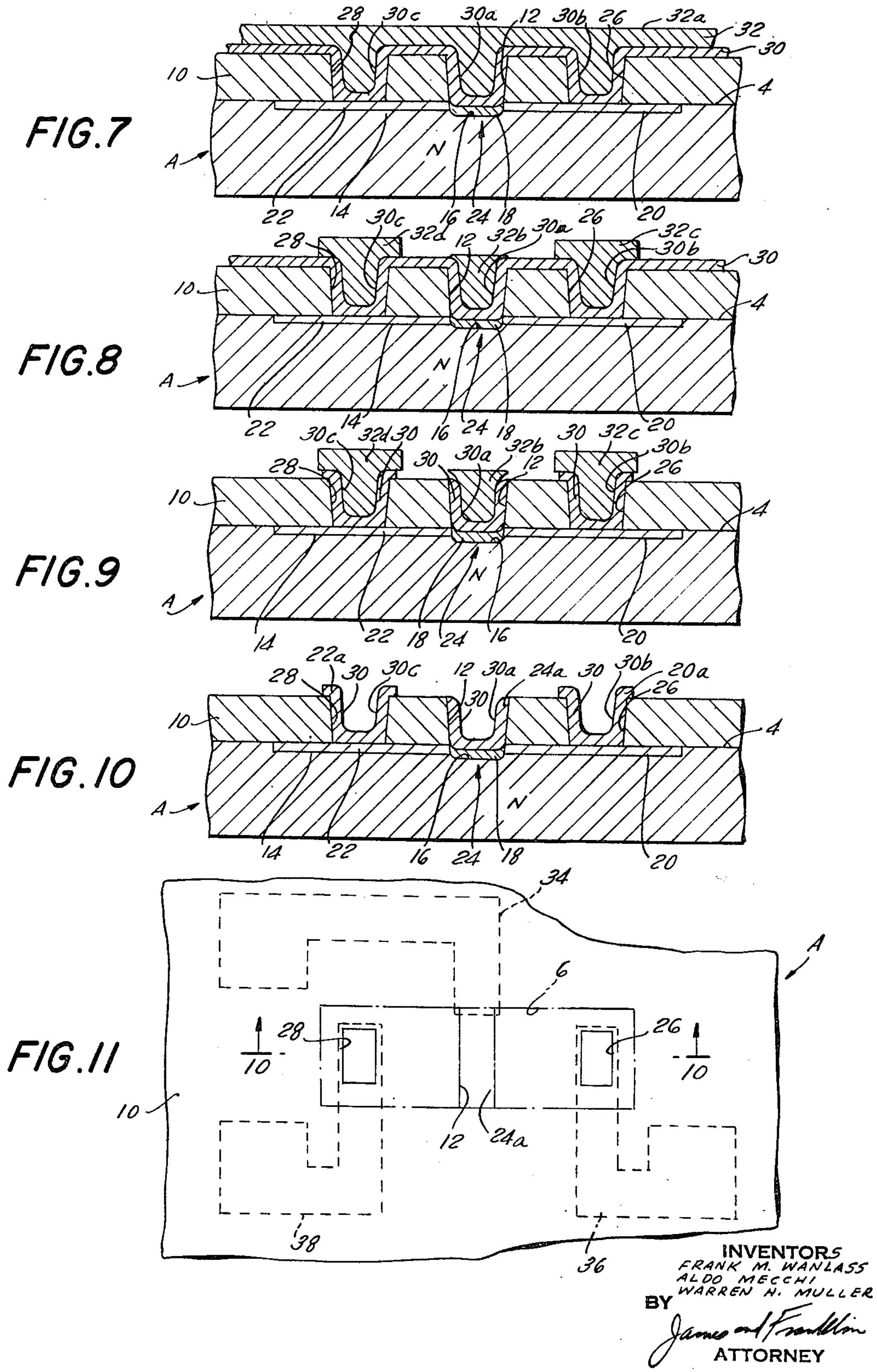

To the accomplishment of the above, and to such other objects as may hereinafter appear, the present invention relates to the design of semiconductor devices and to a method of producing the same, as defined in the appended claims and as described in this specification, taken together with the accompanying drawings in which:

FIGS. 1–10 are schematic cross-sectional views, on a greatly enlarged scale and not drawn to scale, showing different steps in the method of the present invention as applied to the formation of a field effect device, the cross-sectional views being taken along the line 10—10 of FIG. 11; and FIG. 11 is a top plan view, on an enlarged scale, of a portion of an integrated circuit body, in which portion, as it was being fabricated, the steps shown in FIGS. 1–10 took place, broken lines in FIG. 11 indicating the location of external conductive leads formed in accordance with the present invention and making electrical connection with the source, drain and gate electrodes respectively.

Although the invention is here specifically described in connection with the fabrication of a field effect device, this is done only in order to illustrate some of the special advantages which this method has in that connection, and it will be apparent that in its broader aspects the invention is applicable in the formation of other types of semiconductor devices as well. Further, although the present invention is here specifically disclosed in connection with the fabrication of a particular portion of an integrated circuit body, it will be further understood that it could also be used in connection with the fabrication of discrete semiconductor devices.

If a field effect device is to be formed on a selected area of an integrated circuit unit defined by a semiconductor body of a given conductive type and composition, for example N-type silicon, a typical procedure is as follows:

First a masking layer 2, such as silicon dioxide, is grown or otherwise formed on the upper surface 4 of the body A, and then at the area where the field effect device or other semiconductor device is to be formed, a window 6 is produced in the layer 2, as indicated by the dot-dash lines in FIG. 11, in any appropriate manner, as through conventional photolithographic techniques. The cross-sectional views in FIGS. 1–10 may be considered as being taken along the line 10—10 of FIG. 11, within and outside the window 6. Alternatively, the showing in FIGS. 1–10 could be considered as cross-sectional views taken through a discrete semiconductor body A designed to produce an independent semiconductor device.

The next step in the formation of the semiconductor body is to form in the body A and in registration with the window 6 a region 8 of conductivity type opposite to that of the body A. In the example here specifically disclosed the region 8 is of P-type, and may be formed by vapor depositing boron through the window 6 at a temperature of approximately 940° C. for a period of approximately 20 minutes, all as is well known in the art. Under the stated conditions the boron will diffuse into the body A to a depth of about 0.1 micron. Alternatively, the P-type region 8 can be formed in the manner specifically disclosed in the aforementioned application Ser. No. 566,837, or in any other fashion. The resultant structure is shown in FIG. 1.

Figure 2:
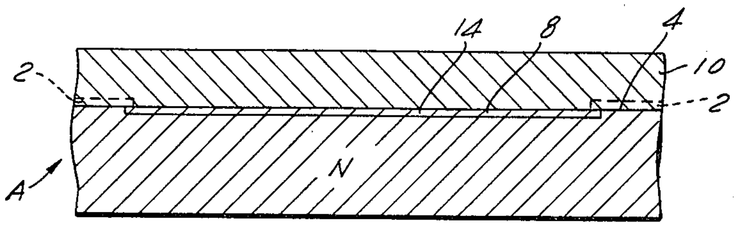

Next, as shown in FIG. 2, an etch-resisting layer 10 is formed on top of the body A over the exposed surface of the region 8 and over the masking layer 2. That layer 10 may be made of any etch-resist but it is here disclosed as formed of silicon dioxide and therefore amalgamates with the silicon dioxide masking layer 2. It is for that reason that the outlines of the layer 2 are shown in broken lines in FIG. 2. It is preferred that the layer 10 be formed by vapor deposition, since that can be carried out at a considerably lower temperature than that which is required for growing a silicon dioxide layer. A conventional vapor deposition procedure may be carried out at 300° C. for a period of about 10 minutes, thus producing a layer 10 having a depth or thickness of about 1.5 micron. The thus-deposited layer 10 is then densified by subjecting it to a temperature of about 950–1000° C. for a period of 20 minutes. This temperature is comparable to that required for the growing of silicon dioxide, but a period of about 10 hours would be required for growing a layer of the thickness of layer 10, whereas growth temperatures are applied to the device only for a very much shorter period of time in connection with the densification step described. Hence no appreciable silicon dioxide growth occurs.

Figure 3:
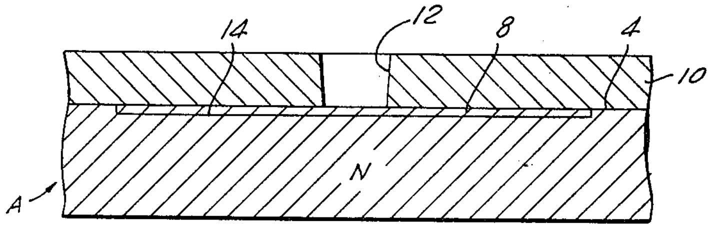

Next, as shown in FIG. 3, an opening 12 is formed in the silicon dioxide layer 10 at the location where the gate area is to be formed, the hole 12 being dimensioned to correspond to the desired dimensions of the gate area. It may therefore have a width of approximately 4–5 microns. Its length and configuration will be dictated by other circuit considerations. The hole 12 may be formed in any appropriate manner, as by a conventional photoresist method using an accurately formed mask of photographic negative to develop selected areas of the photo-resist material, that material then being removed where the opening 12 is to be formed, after which the opening 12 is formed by a conventional etching step, using an etchant which attacks silicon dioxide. A typical such etchant is a buffered combination of hydrofluoric acid and ammonium fluoride.

Figure 4:
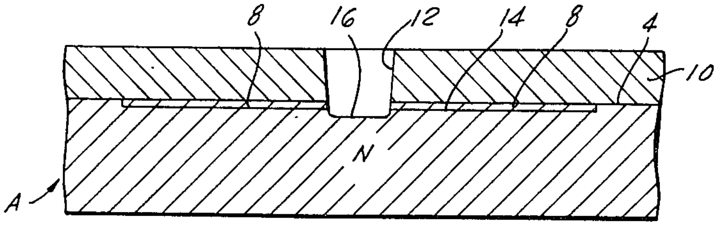

Next, and as shown in FIG. 4, that section of the boron-penetrated region 8 which lies in registration with the opening 12 is removed. This may be done mechanically, with the opening 12 serving as a locating guide, but chemical action is preferred. An etchant for the boron-penetrated silicon region 8 may comprise ten parts of acetic acid, one part of hydrofluoric acid and one part of nitric acid, but neither this specific composition nor the specific proportions set forth are critical, and many substances are known to be capable of preferentially etching a boron-containing silicon when compared to the silicon dioxide or other material of which the layer 10 is formed. The silicon removal in registration with the opening 12 is generally carried out to a point somewhat below the line 14 representing the junction between the P-type area 8 and the N-type body A. This produces in the upper surface of the body A a recess 16 which registers with the opening 12 in the silicon dioxide layer 10.

Figures 5, 6:
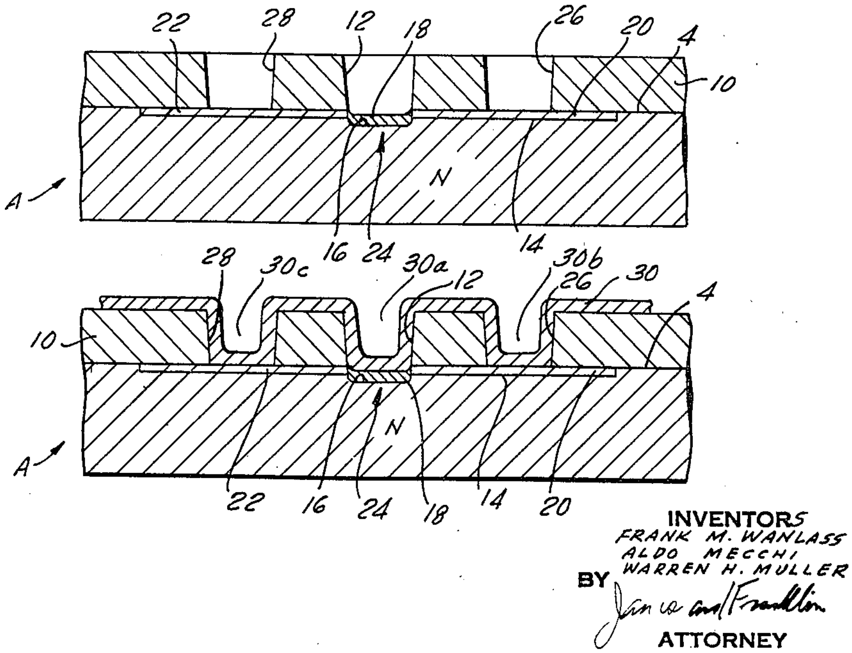

Thereafter, and as shown in FIG. 5, a thin oxide layer 18 is formed in the recess 16 covering the surface of the body A exposed in that recess. This may be done by subjecting the device to a temperature of about 950° C. for 15 minutes, that time-temperature schedule being sufficient to cause the growth of a silicon dioxide layer 18 having a thickness of approximately 1200 Angstroms. This results in the production of a field effect semiconductor device having source and drain regions 20 and 22 respectively, separated by a gate region generally designated 24, the gate region 24 being created by the recess 16 registering with the opening 12 and the silicon dioxide layer 10 and being covered by the thin oxide layer 18. In order to make electrical connection to the source and drain regions 20 and 22 respectively, openings 26 and 28 are formed in the silicon dioxide layer 10 registering and communicating with the source and drain regions 20 and 22 respectively. The openings 26 and 28 may be formed by conventional techniques and, because of the comparatively great width of the source and drain regions 20 and 22 respectively, no mechanical registration problems are presented.

The device as shown in FIG. 5 corresponds closely with that shown in FIG. 7 of the aforementioned application Ser. No. 566,837.

Next, as shown in FIG. 6, the exposed upper surface of the device is covered or substantially covered by a thin conductive layer 30 which is of substantially uniform thickness even where it penetrates and coats the surfaces of the openings 12, 26 and 28. The layer 30 may be formed of any suitable conductive material such as aluminum and may be applied by means of vapor deposition. A conductive layer 30 having a thickness of approximately 6000 Angstroms is suitable for use with devices in which, as here specifically disclosed, the thickness of the layer 10 is approximately 15,000 Angstroms or 1.5 microns. As a result, and as may be seen from FIG. 6, the material of the conductive layer 30 only partially fills the openings 12, 26 and 28, there defining "valleys" **30*a*, 30*b* and 30*c*** respectively between "mountains" of conductive material.

Next, as shown in FIG. 7, the device is covered with a layer 32 of photo-resist material having a positive characteristic, that is to say, those areas thereof which are exposed to and developed by light become soft and easily removable, whereas those areas thereof which are not developed by light remain hard and therefore removable only with difficulty. The layer 32 will fill the valleys **30*a*–30*c* and will cover the upper surfaces of the other portions of the conductive layer 30 to a predetermined depth which may be about 1 micron. The depth of the resist material in the valleys 30*a*–30*c*, and particularly in the valley 30*a*, will be greater than 1 micron. The upper surface 32*a* of the layer 32** will be planar.

Disregarding for the present the openings 26 and 28 and the conductive and photo-resist material therein, and turning our attention solely to what takes place within the opening 12 and the region immediately thereadjacent, the device is subjected to light of an intensity and for a period of time such as to fully exposed those minimal-thickness-portions of the layer 32 which lie to either side of the opening 12, the light exposure being terminated before the photo-resist material deep within the valley 30a has been fully exposed. Since no mask is employed no problems of spatial registration between mask and device are involved.

Next, as shown in the central portion of FIG. 8, the fully exposed photo-resist material is removed, as by being washed off. The photo-resist material 32b within the valley 30a was not fully exposed, and consequently it remains in place.

Next, as shown in the central portion of FIG. 9, the device is subjected to an aluminum etchant which does not affect the photo-resist material 32b. As a result the conductive material 30 to either side of the opening 12 is eaten away and removed, but the conductive material 30 in the opening 12 remains in place, being insulated from the action of the etchant by the photo-resist material 30b. Thereafter, as indicated in the central section of FIG. 10, the undeveloped photo-resist material 32b is removed in any appropriate fashion, the conductive material 30 within the opening 12 thus defining an electrode, designated 24a, which lies in registration with the gate area 24 and consequently functions as a gate electrode. The thus-formed gate electrode 24a is in accurate registration with the gate area 34, this being ensured by using, to form the gate electrode 24a, the very same opening 12 which was used to form and locate the gate area 24. It also will be seen to register only with the gate area 34, and not to overlap the adjacent source and drain regions 20 and 22 (except insofar as the walls of the opening 12 may slope slightly outwardly, that slope being greatly exaggerated in the drawings to this application).

In addition to forming the gate electrode 24a, it is usually desired, particularly in integrated circuitry, to form electrodes which make electrical connection with the source and drain regions 20 and 22 respectively and to form external electrical connections to all three electrodes. This may be done simultaneously with the formation of the gate electrode 24 as described above, and it is to this end that the openings 26 and 28 were formed in the silicon dioxide layer 10 (see FIG. 5). As shown in FIG. 6, a continuous conductive coating 30 is provided which enters the openings 12, 26 and 28 and which covers the upper surface of the silicon dioxide layer 10, and, as shown in FIG. 7, a continuous photo-resist layer 32 is positioned on top of the continuous conductive coating 30. Thereafter, as shown in FIG. 11, light masking areas 34, 36 and 38 are appropriately positioned over the device, but, it will be noted, considerable leeway is permitted in registration of the areas 34–38 with the semiconductor unit. The area 34 defines the external electrical connection to the gate electrode 24a. It may be considerably wider than the gate electrode 24a and overlaps the area where the gate electrode 24a is to be formed only slightly at an end thereof. The areas 36 and 38 represent the external electrical connections to the source and drain areas 20 and 22 respectively, and they extend over those areas so as to cover the photo-resist layer 32 in registration with the openings 26 and 28 respectively. After the masking areas 34–38 have been appropriately positioned the device is subjected to light as described above. Since all but a small portion of the length of the area where the gate electrode 24a is to be formed is not masked, that gate electrode 24a will be formed as described above. The masking areas 34–38 will, as is conventional, prevent the regions of the photo-resist material 32 therebelow from becoming exposed by the light. Consequently, as shown in FIG. 8, after the light-exposure step has been terminated, the unmasked portions of the photo-resist layer 32 will be washed away (except for the portion 32b in the valley 30a, as described above), but the masked portions of the photo-resist layer, designated 32c and 32d in FIG. 8, will remain. When the device is subjected to the action of an aluminum etchant the structure of FIG. 9 will result, the conductive material 30 remaining in the openings 26 and 28 as well as long the routes delineated by the masks 34–38. When the remaining photo-resist material is removed, source and drain electrodes 20a and 22a will be formed in the openings 26 and 28 respectively and these will be integral and conductively continuous with the external conductive paths defined by the masks 36 and 38, just as the gate electrode 24a is integral and conductively continuous with the external conductive path defined by the mask 34.

The method described results in the production of a semiconductor device of truly minimal size. It is possible in accordance with the present invention to produce devices having gate areas with a width of 4–5 microns and gate electrodes which accurately and reliably register therewith, without any appreciable overlap of the adjacent source and drain regions. This represents a reduction of approximately 50 percent in the minimum gate area widths formerly thought possible. Hence integrated circuits may be made in which the gate areas are spaced from one another, from centerline to centerline, by a distance of approximately 0.6 mil, this comparing with the centerline spacing of approximately 1.2 mils in the best of prior art devices. The devices made with the present invention have response times on the order of 0.25 nanosecond and an overlap or feedback capacitance of 0.5–.1 picofarad, this comparing with speeds of response of about 2.5 nanoseconds and feedback capacitance of 2–3 picofarads in the best of prior art devices. Significantly, and most surprisingly, this significant reduction in size, improvement in speed of response, and minimization of feedback capacitance is accomplished by means of a manufacturing procedure which is substantially more reliable than prior art procedures, primarily because the requirements for registration between mask and device is much less stringent in accordance with the instant teachings than in accordance with prior art practices.

While the specific description here given has been in connection with the use of N-type silicon into which boron has been diffused to form P-type regions, it will be understood that the semiconductor material may be of any known composition such as germanium, selenium or the like, that the body A may initially be of P-type or even intrinsic, that the impurity can be either of N- or P-type and can be constituted by any substance known to be a significant impurity, that the geometry and dimensions may be widely varied from what is here specifically disclosed, and that many other variations may be made in the specific disclosure here made, all within the spirit of the invention as defined in the following claims.

We claim:

1. The method of forming a semiconductor device which comprises:

(1) starting with a semiconductor body having an operative surface, two operative areas extending to said operative surface and separated by an intermediate area, a first oxide layer substantially over said intermediate area, and a second oxide layer over portions of said operative areas extending to said operative surface adjacent said intermediate area, said second oxide layer defining a first opening registering and communicating with said first oxide layer;

(2) forming a layer of conductive material which extends both within said first opening, so as to substantially cover said first oxide layer, and over the upper surface of said second oxide layer adjacent said first opening;

(3) removing said conductive material from said upper surface of said second oxide layer substantially completely around at least two sides of said first opening while permitting conductive material to remain in said opening; and (4) making electrical connection to said conductive material remaining in said opening, in which, in step (2), said layer of conductive material only partially fills said first opening, a valley being defined by the upper surface of said conductive layer in said first opening, and step(3) is accomplished by (a) covering said conductive layer with a layer of photo-resist material which substantially fills said valley, the thickness of said photo-resist layer in said valley saving a first value greater than a second value corresponding to the thickness of said photo-resist layer adjacent said valley, (b) exposing said photo-resist layer to light of intensity such, and for a duration such, as to completely operatively affect said photo-resist layer portions having a thickness of said second value but to incompletely operatively affect those photo-resist layer portions having a thickness of said first value, (c) removing said operatively affected photo-resist layer portions, and (d) removing said conductive layer at the areas exposed by the removal of said photo-resist layer portions.

2. The method of claim 1, in which said photo-resist layer has a thickness on the order of 1 micron.

3. The method of claim 2, in which the depth of said opening is on the order of 1.5 microns.

4. The method of claim 2, in which the depth of said opening is on the order of 1.5 microns and the thickness of said conductive layer is on the order of .6 micron.

5. The method of claim 2, in which the depth of said opening is on the order of 1.5 microns and the thickness of said conductive layer is on the order of .6 micron, said conductive layer being formed by vapor deposition.

6. The method of claim 2, in which the width of said first opening, defining the separation between said operative body areas, is on the order of 4–5 microns and the depth of said first opening is on the order of 1.5 microns.

7. The method of claim 2, in which the width of said first opening, defining the separation between said operative body areas, is on the order of 4–5 microns, the depth of said first opening is on the order of 1.5 microns, and the thickness of said conductive layer is on the order of .6 micron.

8. The method of claim 2, in which the width of said first opening, defining the separation between said operative body areas, is on the order of 4–5 microns, the depth of said first opening is on the order of 1.5 microns, and the thickness of said conductive layer is on the order of .6 micron, said conductive layer being formed by vapor deposition.

9. The method of claim 2, in which the depth of said opening is on the order of 1.5 microns.

10. The method of claim 2, in which the depth of said opening is on the order of 1.5 microns and the thickness of said conductive layer is on the order of .6 micron.

11. The method of claim 2, in which the depth of said opening is on the order of 1.5 microns and the thickness of said conductive layer is on the order of .6 micron, said conductive layer being formed by vapor deposition.

12. The method of claim 2, in which the width of said first opening, defining the separation between said operative body areas, is on the order of 4–5 microns and the depth of said first opening is on the order of 1.5 microns.

13. The method of claim 2, in which the width of said first opening, defining the separation between said operative body areas, is on the order of 4–5 microns, the depth of said first opening is on the order of 1.5 microns, and the thickness of said conductive layer is on the order of .6 micron.

14. The method of claim 2, in which the width of said first opening, defining the separation between said operative body areas, is on the order of 4–5 microns, the depth of said first opening is on the order of 1.5 microns, and the thickness of said conductive layer is on the order of .6 micron, said conductive layer being formed by vapor deposition.

References Cited

UNITED STATES PATENTS

| | | | |
|---|---|---|---|
| 2,858,489 | 10/1958 | Henkels | 29—571 |
| 2,981,877 | 4/1961 | Noyce | 148—33.3 |
| 3,025,589 | 3/1962 | Hoerni | 29—589 |
| 3,247,428 | 4/1966 | Perri ea al. | 29—578 |
| 3,280,391 | 10/1966 | Bittmann et al. | 29—576 |
| 3,298,863 | 1/1967 | McCosker | 29—578 |
| 3,309,585 | 3/1967 | Forrest | 317—234 |
| 3,341,743 | 9/1967 | Ramsey | 317—101 |
| 3,372,063 | 3/1968 | Suzuki | 148—1.5 |

PAUL M. COHEN, Primary Examiner

U.S. Cl. X.R.

29—577, 578, 589

UNITED STATES PATENT OFFICE
CERTIFICATE OF CORRECTION

Patent No. 3,503,124 March 31, 1970

Frank M. Wanlass et al.

It is certified that error appears in the above identified patent and that said Letters Patent are hereby corrected as shown below:

In the heading to the printed specification, lines 4 to 7, "Frank M. Wanlass, 30 Mulberry Court, Jericho, N. Y. 11753; Aldo Mecchi, 102 E. Cypress Lane, Westbury, N. Y. 11590; and Warren H. Muller, 2 Wyngate Place, Great Neck, N. Y. 11021" should read -- Frank M. Wanlass, Jericho; Aldo Mecchi, Westbury; and Warren H. Muller, Great Neck, N. Y., assignors to General Instrument Corporation, Newark, N. J., a corporation of Delaware --.

Signed and sealed this 8th day of December 1970.

(SEAL)
Attest:

EDWARD M.FLETCHER,JR.
Attesting Officer

WILLIAM E. SCHUYLER, JR.
Commissioner of Patents